United States Patent
Chen (10) Patent No.: US 7,786,568 B2
(45) Date of Patent: Aug. 31, 2010

(54) WINDOW BGA SEMICONDUCTOR PACKAGE

(75) Inventor: Chin-Ti Chen, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 221 days.

(21) Appl. No.: 12/242,315

(22) Filed: Sep. 30, 2008

(65) Prior Publication Data

US 2010/0078812 A1   Apr. 1, 2010

(51) Int. Cl.
*H01L 23/04* (2006.01)
*H01L 23/48* (2006.01)

(52) U.S. Cl. ............... 257/698; 257/782; 257/783; 257/784; 257/787; 257/E23.001; 257/E23.04; 257/E23.069

(58) Field of Classification Search ............... 257/698, 257/773, 776, 787, 782–784, E23.001, E23.04, 257/E23.069
See application file for complete search history.

(56) References Cited

U.S. PATENT DOCUMENTS

| | | | |
|---|---|---|---|
| 6,091,143 A * | 7/2000 | Akram | 257/723 |
| 6,343,019 B1 * | 1/2002 | Jiang et al. | 361/761 |
| 6,861,737 B1 * | 3/2005 | Jeong et al. | 257/680 |
| 7,425,758 B2 * | 9/2008 | Corisis et al. | 257/686 |
| 7,432,601 B2 * | 10/2008 | Chen | 257/778 |

* cited by examiner

*Primary Examiner*—Jasmine J Clark
(74) *Attorney, Agent, or Firm*—Muncy, Geissler, Olds & Lowe, PLLC (57) ABSTRACT

A WBGA semiconductor package primarily comprises a substrate, a chip, a chip-bonding adhesive, a plurality of bonding wires electrically connecting the chip and the substrate, an encapsulant to encapsulate the chip and the bonding wires, and a plurality of external terminals disposed under the substrate. The substrate has a depression for accommodating the chip-bonding adhesive and a slot for passing through bonding wires. The chip is partially embedded in the depression to dispose on the substrate. During the chip bonding step, the chip-bonding adhesive is confined in the depression in a manner to fill the gaps between the sides of the first chip and the inwalls around the depression to generate a non-planar adhering interface by partially covering the sides of the first chip. Therefore, the total package thickness is reduced, the delamination of the passivation layer and the fractures at the sides of the chip are avoided.

13 Claims, 6 Drawing Sheets

WINDOW BGA SEMICONDUCTOR PACKAGE

The present invention relates to a semiconductor device, especially to a window BGA (Ball Grid Array) semiconductor package.

BACKGROUND OF THE INVENTION

Among many semiconductor packages, Window Ball Grid Array (WBGA) is a semiconductor package with a slot opened in a chip-carrying substrate for passing bonding wires through the slot to electrically connect the substrate to the chip where the chip is attached to the top of the substrate. Then external terminals such as solder balls are disposed on the bottom surface of the substrate for mounting to an external printed circuit board. However, when a chip is attached onto the substrate by either liquid-type or paste-type chip-bonding adhesives, the chip-bonding adhesives become flowing due to raised temperatures and exerted pressures during the chip bonding processes leading to bleeding where the chip-bonding adhesives may bleed to bonding pads leading wire bonding failure. Therefore, the existing WBGA semiconductor package only can use die-attaching tapes to replace liquid-type or paste-type chip-bonding adhesives to avoid bleeding. Normally, the die-attaching tapes is only planarly attached to the active surface of a chip which is easily affected by the external stresses leading to delamination at the interface or fractures at the sides of the chips where the reliability and the quality of the conventional WBGA semiconductor package are impacted.

Figure 1:
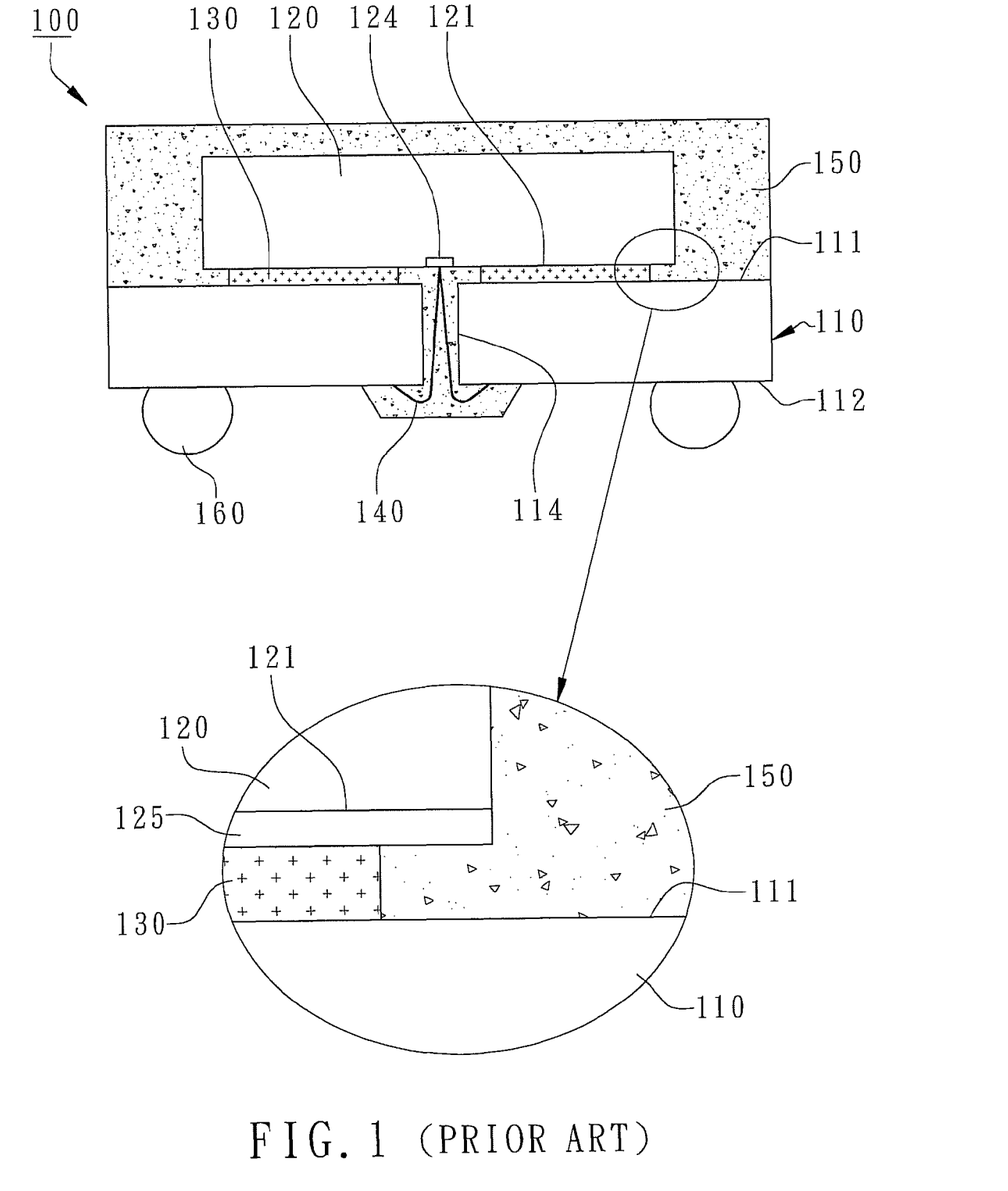
FIG. 1 shows the cross-sectional view with an embedded partially enlarged cross-sectional view of a conventional WBGA semiconductor package.

As shown in FIG. 1, a conventional WBGA semiconductor package primarily comprises a substrate 110 as a chip carrier, a chip 120, a die-attaching tape 130, a plurality of bonding wires 140, an encapsulant 150, and a plurality of external terminals 160. The substrate 110 has an internal surface 111, an external surface 112, and a slot 114 penetrating from the internal surface 111 to the external surface 112. The chip 120 has an active surface 121 and a plurality of bonding pads 124 disposed on the active surface 121. The chip-bonding adhesive 130 is attached to the active surface 212 of the chip 120 and to the internal surface 111 of the substrate 110 to firmly hold the chip 120 on the substrate 110 with the slot 114 exposed after die-attaching processes. A passivation layer 125 is formed on the active surface 121 of the chip 120. The bonding pads 124 are electrically connected to the substrate 110 by the bonding wires 140 passing through the slot 114. The encapsulant 150 encapsulates the chip 120 and the bonding wires 140. The external terminals 160 such as solder balls are disposed on the external surface 112 of the substrate 110. As shown in the enlarged drawing embedded in FIG. 1, since the die-attaching tape 130 is only partially attached to the passivation layer 125 on the active surface 121, thermal stresses during molding processes or temperature cycle test (TCT) will easily cause delamination of the passivation layer 125 from the chip 120 or fractures at the sides of the chip 120.

SUMMARY OF THE INVENTION

The main purpose of the present invention is to provide a WBGA semiconductor package and the method for fabricating the same to reduce the total package thickness and to effectively resolve delamination or peeling of the passivation layer and fractures at chip sides.

According to the present invention, a WBGA semiconductor package is revealed, primarily comprising a substrate, a first chip, a chip-bonding adhesive, a plurality of first bonding wires, an encapsulant, and a plurality of external terminals. The substrate has an internal surface, an external surface, a depression formed in the internal surface, and a slot penetrating from the external surface to the depression. The first chip is partially embedded in the depression and protrudes from the internal surface of the substrate. The first chip has a first active surface, a first back surface, and a plurality of sides between the first active surface and the first back surface. The chip-bonding adhesive is formed inside the depression to adhere the first chip where the chip-bonding adhesive is confined in the depression in a manner to fill the gaps between the sides of the first chip and the inwalls around the depression to partially cover the sides of the first chip. The first bonding wires pass through the slot to electrically connect the first chip to the substrate. The encapsulant is formed on the internal surface of the substrate and in the slot to encapsulate the first chip and the first bonding wires. The external terminals are disposed on the external surface of the substrate.

The WBGA semiconductor package revealed according to the present invention has the following advantages and functions:

1. Since a depression is formed inside the internal surface of a substrate to partially embed the first chip into the depression, the total package thickness is reduced.

2. Since the chip-bonding adhesive fills the gaps between the sides of the first chip and the inwalls around the depression, the sides of the first chip are partially covered to generate a non-planar adhering interface to increase chip bonding strengths.

3. When the chip-bonding adhesive completely encapsulates the passivation layer of the first chip including the peripheral edges of the passivation layer, the stresses exerted on the first chip is reduced, and also delamination of the passivation layer and fractures at the sides of the first chip are avoided.

4. When the chip-bonding adhesive further covers the bonds of the first bonding wires on the first chip, wire sweeping or broken wires of the first bonding wires caused by mold flows during molding processes can be avoided.

5. Preferably, the substrate has a stepped indentation between the external surface and the slot to provide a wire-bonding area on a substrate adjacent to the chip, the bonding wires have a lower loop height to reduce the risk of exposing bonding wires.

DETAIL DESCRIPTION OF THE INVENTION

Please refer to the attached drawings, the present invention is described by means of embodiments below.

Figure 2:
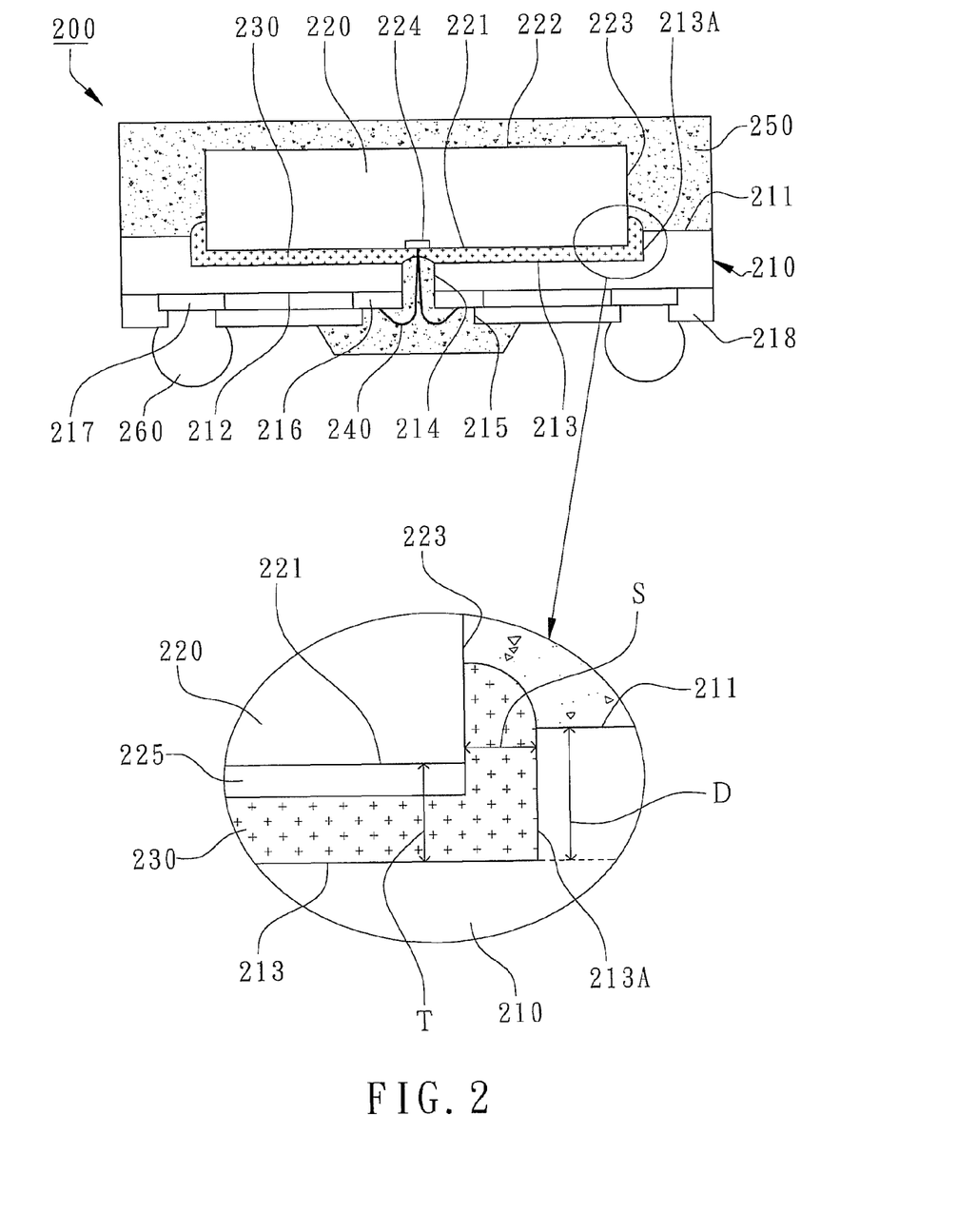
FIG. 2 shows the cross-sectional view with a partially enlarged cross-sectional view of a WBGA semiconductor package according to the first embodiment of the present invention.

According to the first embodiment of the present invention, a WBGA semiconductor package 200 is illustrated in a cross-sectional view including a partially enlarged cross-sectional view of FIG. 2.

As shown in FIG. 2, the WBGA semiconductor package 200 primarily comprises a substrate 210, a first chip 220, a chip-bonding adhesive 230, a plurality of first bonding wires 240, an encapsulant 250, and a plurality of external terminals 260. The substrate 210 has an internal surface 211, an external surface 212, a depression 213 formed in the internal surface 211, and a slot 214 penetrating from the external surface 212 to the depression 213. The internal surface 211 is the surface of the substrate 210 without exposing from the encapsulant 250 for disposing the first chip 220 where the external surface 212 is the surface of the substrate 210 exposing from the encapsulant 250 for disposing the external terminals 260. The slot 214 may be a central slot to expose a plurality of first bonding pads 224 of the first chip 220 from the slot 214 and to pass through the first bonding wires 240. In the present embodiment, the substrate 210 has a stepped indentation 215 formed between the external surface 212 and the slot 214 to reduce the loop heights of the first bonding wires 240. To be more specific, as shown in FIG. 2 again, the substrate 210 further has a plurality of external bonding pads 217 and a plurality of first bonding fingers 216 on the external surface 212. To be further more specific, the first bonding fingers 216 are formed and arranged at the stepped indentation 215 to provide electrical connections for the first bonding wires 240. The external bonding pads 217 are normally round ball pads arranged in an array or in multiple rows at the peripheries for the placement of the external terminals 260. The substrate 210 further has a solder mask 218 formed on the external surface 212 with the external bonding pads 217 exposed. In the present embodiment, the solder mask 218 further forms the stepped indentation 215 with exposing the first bonding fingers 216. Normally the substrate 210 is a circuit substrate such as a printed circuit board, a ceramic substrate or a pre-molded leadframe.

As shown in FIG. 2, the first chip 220 is partially embedded in the depression 213 and protrudes from the internal surface 211 of the substrate 210. The first chip 220 has a first active surface 221, a first back surface 222, and a plurality of sides 223 between the first active surface 221 and the first back surface 222. To be more specific, the dimension of the first chip 220 is slightly smaller than the depression 213 where the first chip 220 is partially embedded inside the depression 213 with the first active surface 221 facing to the substrate 210. A plurality of inwalls (inner walls) 213A around the depression 213 are located outside the first chip 220 and are adjacent to the sides 223 of the first chip 220 where there is a gap S formed between the sides 223 of the first chip 220 and the inwalls 213A around the depression 213. The first bonding pads 224 on the first active surface 221 of the first chip 220 are aligned in the slot 214 with the first bonding wires 240 passing through the slot 214 and bonding on the first bonding pads 224. In the present embodiment, the first bonding pads 224 are located at the center of the first active surface 221, i.e., the first bonding pads 224 are central pads in a single row or a plural rows to be the external terminals for the IC's inside the first chip 220. The materials of the first bonding pads 224 can be aluminum, copper, or aluminum alloy. In the present embodiment, as shown in the enlarged drawing in FIG. 2, the first chip 220 further includes a passivation layer 225 formed on the first active surface 221 with the first bonding pads 224 exposed. The passivation layer 225 is chosen from Polyimide (PI), Benzocyclobutene (BCB), or silicide where silicide includes silicon dioxide or silicon nitride. The passivation layer 225 is adhered by the chip-bonding adhesive 230.

As shown in FIG. 2, the chip-bonding adhesive 230 is formed inside the depression 213 to adhere the first chip 220 where the chip-bonding adhesive 230 is confined in the depression 213 in a manner to fill the gaps S between the sides 223 of the first chip 220 and the inwalls 213A around the depression 213 to partially cover the sides 223 of the first chip 220. Bleeding height of the chip-bonding adhesive 230 outside the first chip 220 is controlled well. Therefore, the chip bonding area of the chip-bonding adhesive 230 against the chip 220 is increased to be non-planar such as having a U-shaped cross-section so that the chip bonding strength between the first chip 220 and the substrate 210 can be enhanced. Preferably, the depth D of the depression 213 is larger than the sum T of the thickness of the chip-bonding adhesive 230 between the chip 220 and a bottom of the depression 213 and the thickness of the passivation layer 225 but smaller than the thickness of the first chip 220 so that the passivation layer 225 is completely embedded in the depression 213 and the first chip 220 can be partially embedded into the depression 213 to reduce the total package thickness. Therein, the thickness of the chip-bonding adhesive 230 stands for the shortest distance from the passivation layer 225 to the bottom of the depression 213. Preferably, since the passivation layer 225 of the first chip 220 is completely embedded in the depression 213, the passivation layer 225 including its peripheral edges is fully encapsulated by the chip-bonding adhesive 230 to avoid delamination or peeling of the passivation layer 225 from the first chip 220. The chip-bonding adhesive 230 may be B-stage adhesive with multiple curing stages to adjust the coverage of the sides 223 of the first chip 220.

As shown in FIG. 2, the first bonding wires 240 pass through the slot 214 to electrically connect the first bonding pads 224 of the first chip 220 to the first bonding fingers 216 of the substrate 210 to form electrical connections between the first chip 220 and the substrate 210. The first bonding wires 240 are formed by wire-bonding technology where the materials of the first bonding wires 240 can be conductive metal materials such as gold or copper. In a preferable embodiment, since the first bonding fingers 216 are located at the stepped indentation 215, therefore, the wire bonding heights between the substrate 210 and the first chip 220 are shorter to reduce the loop heights of the first bonding wires 240 so that smaller diameters of the bonding wires can be implemented. As shown in FIG. 2, the chip-bonding adhesive 230 further can be filled into the slot 214. Preferably, a plurality of bonds of the first bonding wires 240 on the first active surface 221 of the first chip 220 can further be encapsulated by the chip-bonding adhesive 230 due to the re-bonding of the chip-bonding adhesive 230 after wire-bonding step to prevent wire sweeping or broken wires during molding processes.

As shown in FIG. 2, the encapsulant 250 is formed on the internal surface 211 of the substrate 210 and in the slot 214 to encapsulate the first chip 220 and the first bonding wires 240. In the present embodiment, the encapsulant 250 further covers the first back surface 222 of the first chip 220. In different embodiment, the first back surface 222 of the first chip 220 may be exposed from the encapsulant 250 to enhance heat dissipation, not shown in the figure.

As shown in FIG. 2, the external terminals 260 are disposed on the external bonding pads 217 on the external surface 212 of the substrate 210 as the input/output terminals of the WBGA semiconductor package 200 for electrically connecting to external devices such as printed circuit boards. The external terminals 260 include a plurality of solder balls, metal balls, solder paste, contacting pads, or contacting pins.

Therefore, the design of depression 213 can effectively control the bleeding of the chip-bonding adhesive 230 to partially cover the sides 223 of the first chip 220. The die-attaching area becomes non-planar to effectively increase the chip bonding strength and also the total package thickness can be reduced. The delamination or/and peeling of the passivation layer 225 from the first chip 220 and the fractures of the sides 223 of the first chip 220 can be avoided. Moreover, the chip-bonding adhesive 230 is confined by the depression 213 without bleeding to the edges of the substrate 210 so that the encapsulant 250 can completely encapsulate the chip-bonding adhesive 230 to keep good resistance to moisture. Preferably, the chip-bonding adhesive 230 can further encapsulate the bonds of the first bonding wires 240 on the first chip 220 to prevent wire sweeping or broken wires due to mold flow during molding process or TCT.

Figure 3:
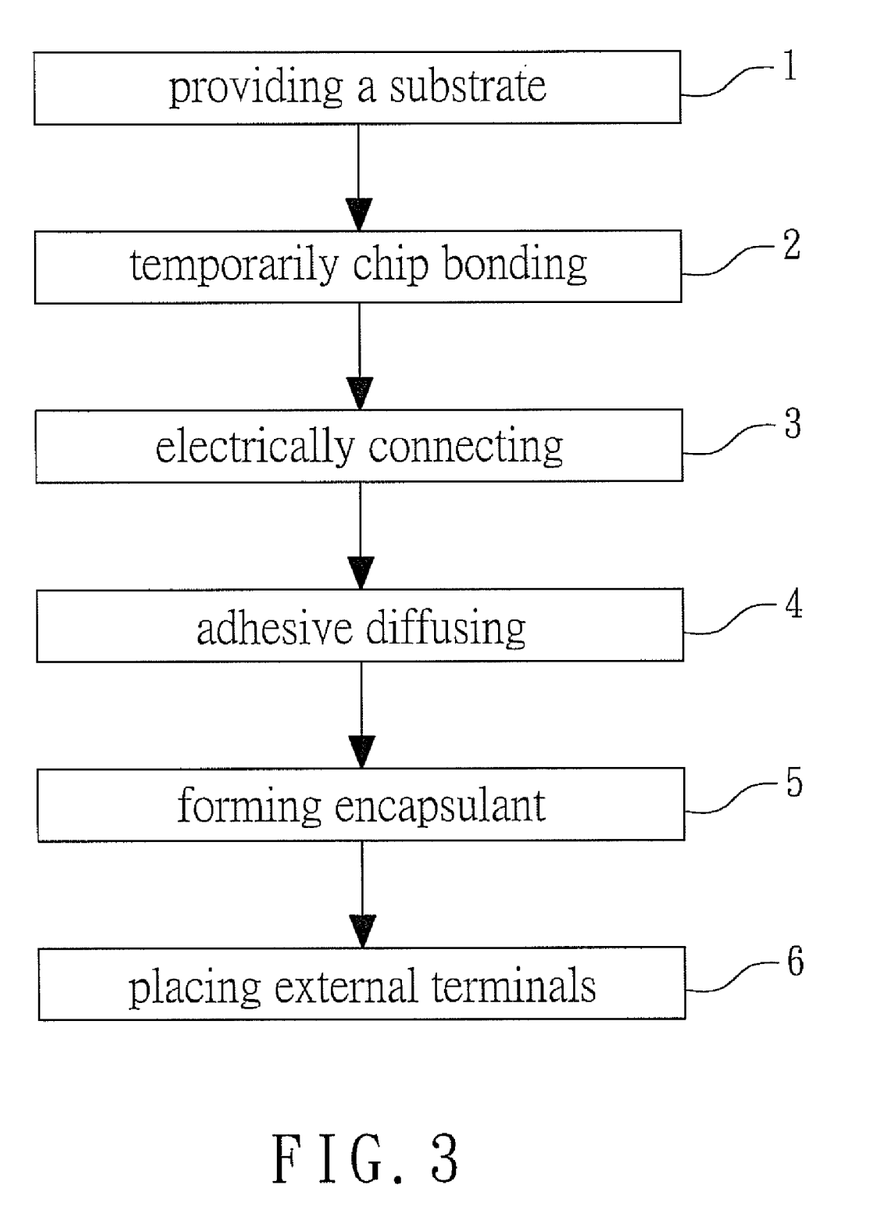
FIG. 3 shows a flow chart of manufacturing the WBGA semiconductor package according to the first embodiment of the present invention.

A manufacturing process of the WBGA semiconductor packages according to the present invention is described in FIG. 3 for showing the flow chart and from FIG. 4A to FIG. 4E for showing the cross-sectional views of the components used in the WBGA semiconductor package during the manufacturing processes.

As shown in FIG. 3, the manufacturing processes of the WBGA semiconductor package primarily comprises the following steps: step 1 of "providing a substrate"; step 2 of "temporarily chip bonding"; step 3 of "electrically connecting"; step 4 of "adhesive diffusing"; step 5 of "forming encapsulant", and step 6 of "placing external terminals" with the detail descriptions from FIG. 4A to FIG. 4E.

Figure 4A:
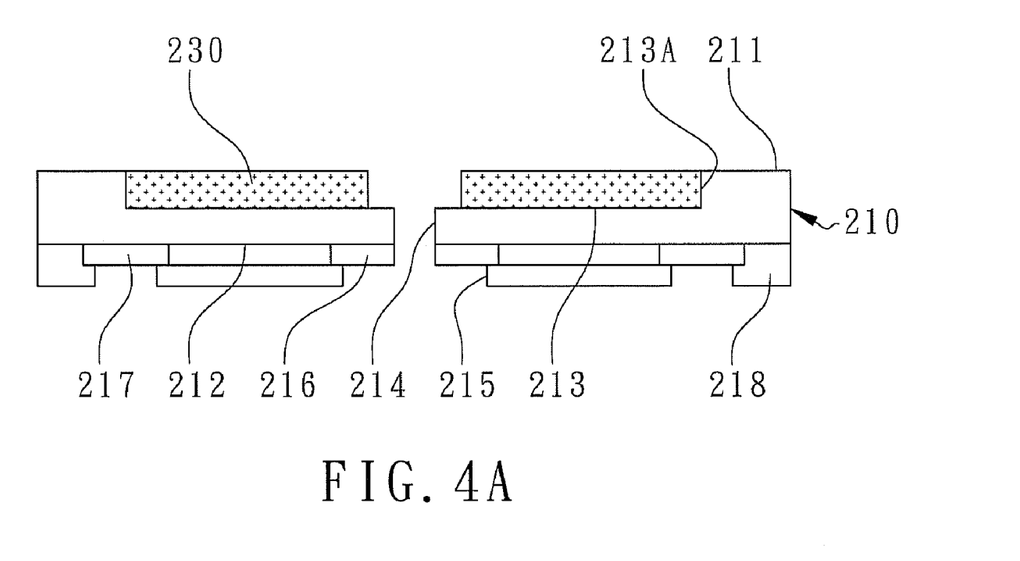
FIGS. 4A to 4E show the cross-sectional views of the components used in the WBGA semiconductor package during the manufacturing processes according to the first embodiment of the present invention.

Firstly, components in step 1 are shown in FIG. 4A, the substrate 210 is provided where a depression 213 is formed in the internal surface 211 and a slot 214 is formed through the substrate 210. The slot 214 penetrates from the external surface 212 to the depression 213. A chip-bonding adhesive 230 is formed inside the depression 213 where there is no circuit on the bottom of the depression 213 so that the depression 213 can be mechanically formed without damaging to the internal circuits of the substrate 210. Preferably, the chip-bonding adhesive 230 is a paste with multiple curing stages with better flowing properties to have better topographic coverage when disposing on the substrate 210. Therefore, the method for forming the chip-bonding adhesive 230 inside the depression 213 can be screen printing or stencil printing. During the process, the slot 214 is not filled with the chip-bonding adhesive 230 in the depression 213. The chip-bonding adhesive 214 can be coplanar or slightly higher than the internal surface 211. The first bonding fingers 216 and the external bonding pads 217 are formed in the same circuit layer of the substrate 210. The substrate 210 further has a solder mask 218 formed on the external surface 212 with the external bonding pads 217 exposed. Moreover, the solder mask 218 further has a stepped indentation 215 to expose the first bonding fingers 216.

Figure 4B:
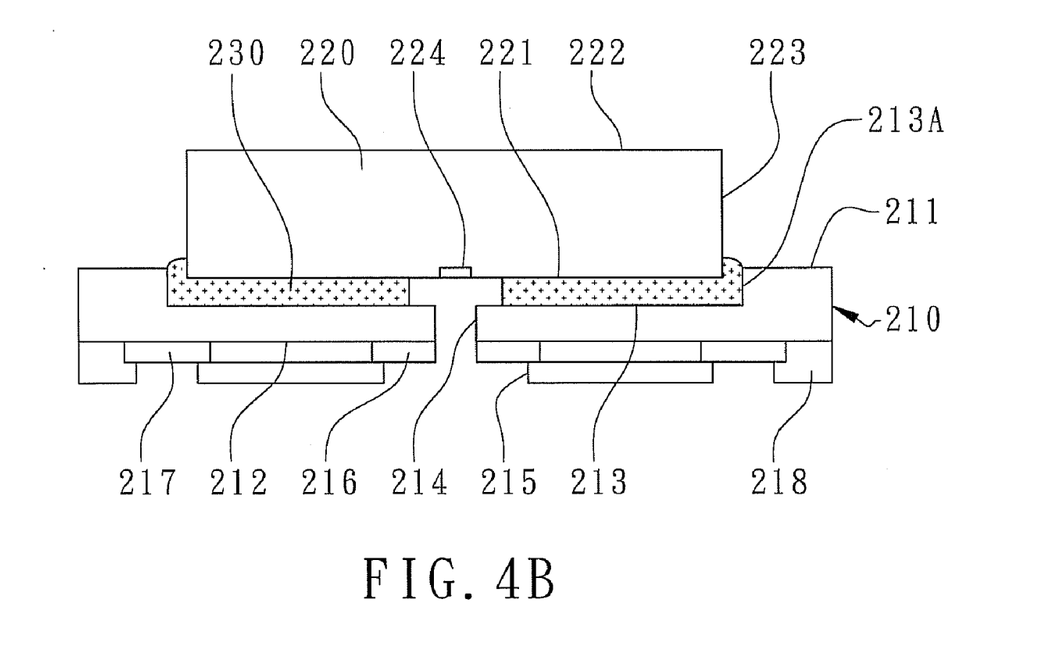

Then, components in step 2 are shown in FIG. 4B, the first chip 220 is aligned within the depression 213 and is temporarily attached to the substrate 210 by the adhesion of the chip-bonding adhesive 230. The first chip 220 is partially embedded into the depression 213 where the chip-bonding adhesive 213 is confined by the depression 213 without excess deformations nor horizontal bleeding. Moreover, the chip-bonding adhesive 230 in step 2 temporarily adheres the first active surface 221 of the first chip 220. The first bonding pads 224 of the first chip 220 are aligned in the slot 214. To be more specific, the substrate 210 needs to be pre-baked so that the chip-bonding adhesive 230 may be half-cured when returned to room temperature to possess thermal adhesions for adhering the first chip 220. The flowing property of the chip-bonding adhesive 230 can be controlled by the chip bonding temperatures to be viscous flows to keep a solid shape without bleeding to the first bonding pads 224 of the first chip 220 which may cause wire bonding failure.

Figure 4C:
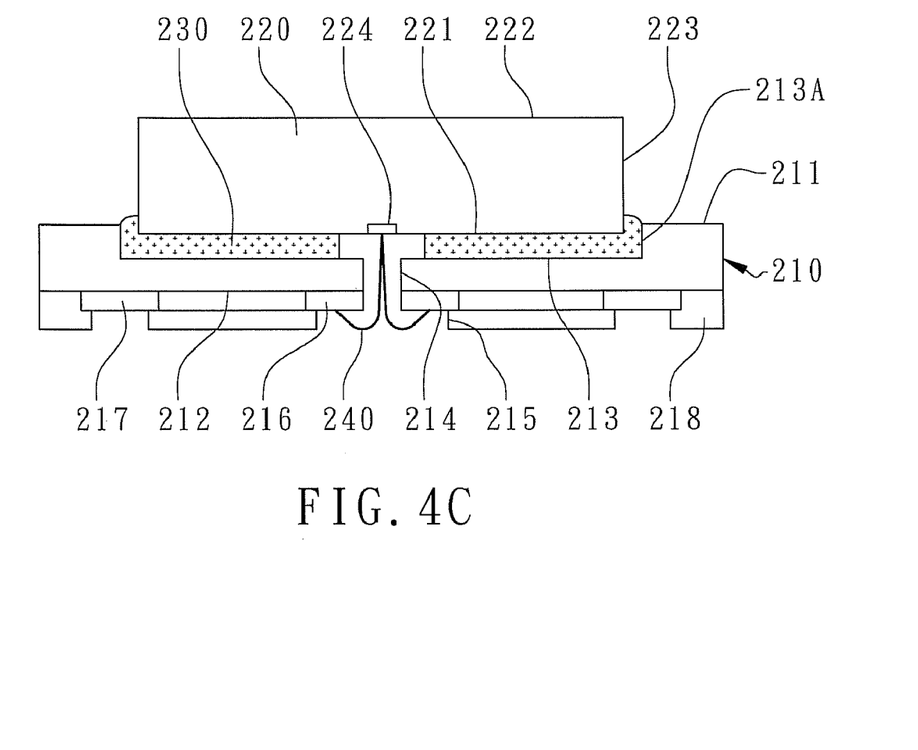

Then, components in step 3 are shown in FIG. 4C, the first bonding wires 240 are formed by wire bonding and pass through the slot 214 to electrically connect the first bonding pads 224 of the first chip 220 to the first bonding fingers 216 of the substrate 210.

Figure 4D:
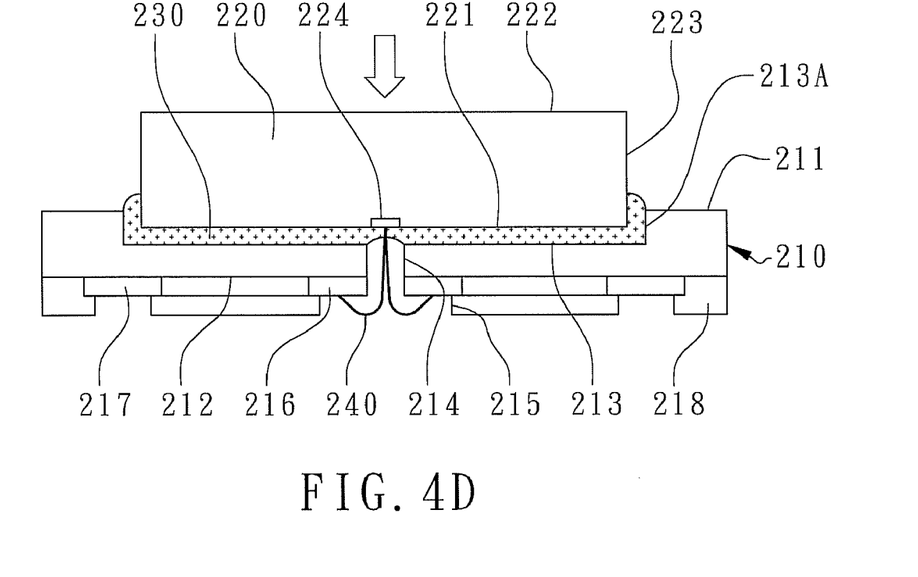

Then, the adhesive diffusing step 4 is performed after the electrically connecting step 3. As shown in FIG. 4D, the first chip 220 is heated and pressed to diffuse the chip-bonding adhesive 230 and to further downset the first chip 220 into the depression 213. The heating temperature and the pressure in step 4 should be higher than the operation conditions of the chip bonding step 2. As the first chip 220 is pressed and is further embedded into the depression 213, the chip-bonding adhesive 230 has a better flowing property by raising the temperature but still is confined by the depression 213 without extending to the edge of the internal surface 211. Moreover, the chip-bonding adhesive 230 further completely fills the gap S between the sides 223 of the first chip 220 and the inwalls 213A around the depression 213, as shown in FIG. 2, and partially covers the sides 223 of the first chip 220. Since the deformation of the chip-bonding adhesive 230 occurs after formation of the first bonding wires 240, therefore, even if the chip-bonding adhesive 230 bleeds to the first bonding wires 240, the bonding strengths of the first bonding wires 240 can be enhanced without any wire bonding failure issues. Preferably, as in step 4, the chip-bonding adhesive 230 can further fill the slot 214. Moreover, the chip-bonding adhesive 230 further encapsulates the bonds of the first bonding wires 240 on the chip 220. After curing, the bonds of the first bonding wires 240 on the first chip 220 are firmly held by the chip-bonding adhesive 230 to prevent wire sweeping or broken wires during the following encapsulating step 5. In the present embodiment, the curing of the chip-bonding adhesive 230 can be proceeded in step 4, after step 4, or in step 5. Furthermore, as shown in FIG. 2 and FIG. 3, to be more specific, in step 4 of "adhesive diffusing", the passivation layer 225 of the first chip 220 is filly embedded into the depression 213 where the passivation layer 225 including its peripheral edges is fully encapsulated by the chip-bonding adhesive 230.

Figure 4E:
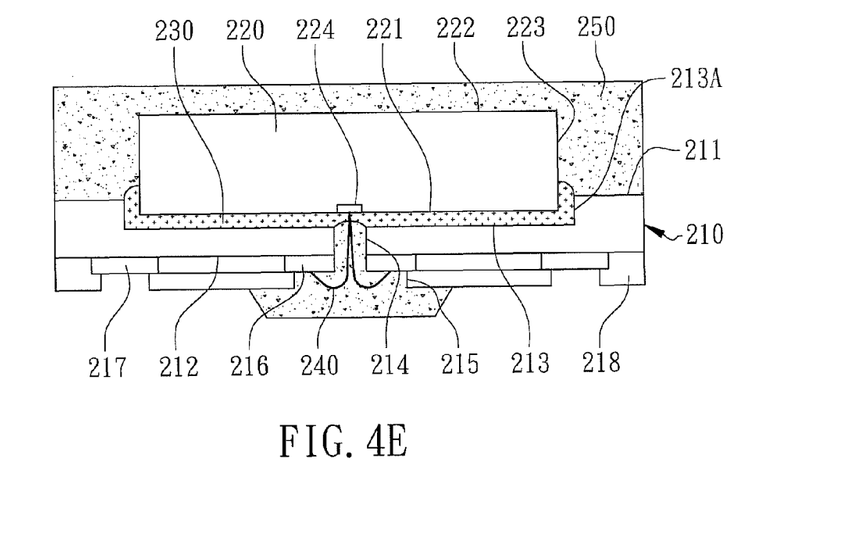

Then, components in step 5 are shown in FIG. 4E, the encapsulant 250 is formed by transfer molding on the internal surface 211 of the substrate 210 and also in the slot 214 to encapsulate the first chip 220 and the first bonding wires 240. Since the depression 213 can confine the chip-bonding adhesive 230 without bleeding to the peripheries of the substrate 210, therefore, the encapsulant 250 can fully encapsulate the chip-bonding adhesive 230. Finally, in step 6, the external terminals 260 are disposed on the external bonding pads 217 by reflowing to fabricate the WBGA semiconductor package 200 as shown in FIG. 2. In a different embodiment, the manufacturing processes of the WBGA semiconductor package 200 can further comprise a step of disposing a second chip, not shown in the figure, to stack the back surface of the second chip on the first back surface 222 of the first chip 220.

Figure 5:
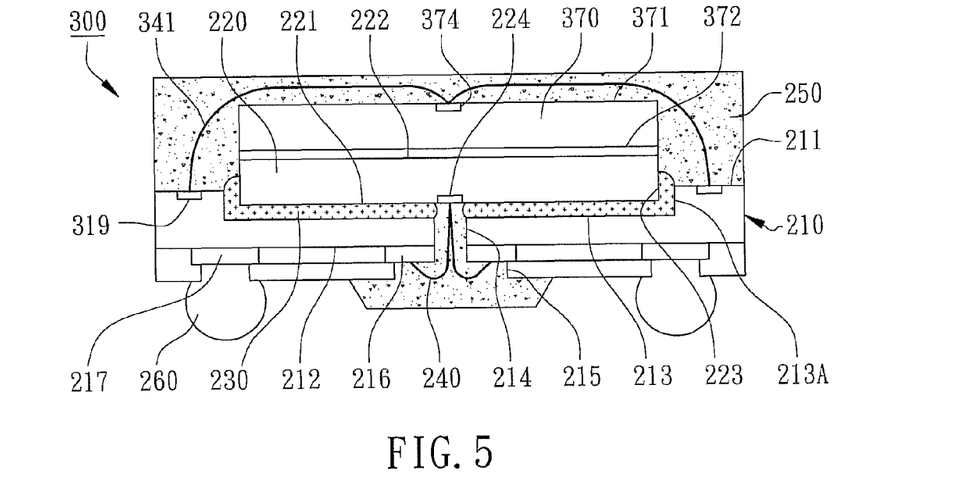
FIG. 5 shows the cross-sectional view of another WBGA semiconductor package according to the second embodiment of the present invention.

According to the second embodiment of the present invention, another WBGA semiconductor package is described in the cross-sectional view of FIG. 5 where the basic package structure is the same as the first embodiment but with more chips stacked.

As shown in FIG. 5, a WBGA semiconductor package 300 primarily comprises a substrate 210, a first chip 220, a chip-bonding adhesive 230, a plurality of first bonding wires 240, an encapsulant 250, and a plurality of external terminals 260 as similar to the components in the first embodiment. The substrate 210 has an internal surface 211, an external surface 212, a depression 213 formed in the internal surface 211, and a slot 214 penetrating from the external surface 212 to the depression 213. The substrate 210 may has a stepped indentation 215 formed between the external surface 212 and the slot 214. A plurality of first bonding fingers 216 are formed on the external surface 212 adjacent to two corresponding sides of the stepped indentation 215 for wire-bonding connection. In the present embodiment, a plurality of second bonding fingers 319 are formed on the internal surface 211 adjacent to the depression 213. The substrate 210 is a multi-layer printer circuit board where the first bonding fingers 216 and the second bonding fingers 319 are electrically connected to a plurality of external bonding pads 217 on the external surface 212. The first chip 220 is partially embedded in the depression 213 and protrudes from the internal surface 211 of the substrate 210 where the first chip 220 has a first active surface 221, a first back surface 222, and a plurality of sides 223 between the first active surface 221 and the first back surface 222. As shown in FIG. 5, the chip-bonding adhesive 230 is formed inside the depression 213 to adhere the first chip 220 where the chip-bonding adhesive 230 is confined in the depression 213. Moreover, the chip-bonding adhesive 230 fills the gap between the sides 223 of the first chip 220 and the inwalls 213A around the depression 213 to partially cover the sides 223 of the first chip 220 so that the first chip 220 is partially embedded into the depression 213 to reduce the total package height and the corners of the first chip 220 around the first active surface 221 are encapsulated by the chip-bonding adhesive 230. As shown in FIG. 5, the first chip 220 has a plurality of first bonding pads 224 formed on the first active surface 221. After the first chip 220 is attached to the substrate 210, the first bonding pads 224 are aligned in the slot 214. The first bonding wires 240 pass through the slot 214 to electrically connect the first bonding pads 224 of the first chip 220 to the first bonding fingers 216 of the substrate 210.

In the present embodiment, the WBGA semiconductor package 300 further has a second chip 370 having a second active surface 371 and a corresponding second back surface 372. The second chip 370 is back-to-back disposed on the first back surface 222 of the first chip 220, i.e., the second back surface 372 of the second chip 370 is attached to the first back surface 222 of the first chip 220 with the second active surface 371 facing upward. The second chip 370 further has a plurality of second bonding pads 374 formed on the second active surface 371. In the present embodiment, the second chip 370 and the first chip 220 can be the same chips with the same chip dimensions, the same electrical functions, and the same pad layouts, therefore, the second bonding pads 374 are the central pads to reduce the variety of chips to further lower the manufacturing and managing cost. The second bonding pads 374 of the second chip 370 are electrically connected to the second bonding fingers 319 of the substrate 210 by a plurality of second bonding wires 341 to electrically connect the second chip 370 to the substrate 210. The encapsulant 250 is formed on the internal surface 211 of the substrate 210 and in the slot 214 to encapsulate the first chip 220, the second chip 370, the first bonding wires 240, and the second bonding wires 341. The external terminals 260 are disposed on the external bonding pads 217 of the external surface 212 of the substrate 210 as external electrical connections.

The depression 313 confines the chip-bonding adhesive 330 where the chip-bonding adhesive 330 may spread and partially cover the sides 323 of the first chip 320 without bleeding to the peripheries of the internal surface 311 of the substrate 310 to prevent contaminations of the second bonding fingers 319. Therefore, there is no need to reserve bleeding tolerances on the internal surface 311 of the WBGA semiconductor package 300 to further shrink the dimension of the package. Eventually, the WBGA semiconductor package 300 not only has reduced the total package thickness, increased the die-attaching strengths to avoid delamination or peeling of the chips, but also to shrink the dimension of the packages.

The above description of embodiments of this invention is intended to be illustrative but not limiting. Other embodiments of this invention will be obvious to those skilled in the art in view of the above disclosure.

What is claimed is:

1. A semiconductor package primarily comprising:
   a substrate having an internal surface, an external surface, a depression formed in the internal surface, and a slot penetrating from the external surface to the depression;
   a first chip partially embedded in the depression and protruding from the internal surface of the substrate, wherein the first chip has a first active surface, a first back surface, and a plurality of sides between the first active surface and the first back surface;
   a chip-bonding adhesive formed inside the depression to adhere the first chip, wherein the chip-bonding adhesive is confined in the depression in a manner to fill a plurality of gaps between the sides of the first chip and a plurality of inwalls around the depression to partially cover the sides of the first chip;
   a plurality of first bonding wires passing through the slot to electrically connect the first chip to the substrate;
   an encapsulant formed on the internal surface of the substrate and in the slot to encapsulate the first chip and the first bonding wires; and
   a plurality of external terminals disposed on the external surface of the substrate.

2. The semiconductor package as claimed in claim 1, wherein the first chip includes a passivation layer formed on the first active surface wherein the passivation layer is fully embedded inside the depression to be fully encapsulated by the chip-bonding adhesive.

3. The semiconductor package as claimed in claim 2, wherein the depth of the depression is greater than the sum of the thickness of the chip-bonding adhesive between the first chip and a bottom of the depression and the thickness of the passivation layer but smaller than the thickness of the first chip.

4. The semiconductor package as claimed in claim 1, wherein the inwalls around the depression are located outside the first chip but adjacent to the sides of the first chip.

5. The semiconductor package as claimed in claim 1, wherein the chip-bonding adhesive is further formed in the slot.

6. The semiconductor package as claimed in claim 5, wherein the chip-bonding adhesive further covers a plurality of bonds of the first bonding wires on the first active surface of the first chip.

7. The semiconductor package as claimed in claim 1, wherein the first chip has a plurality of first bonding pads formed on the first active surface and aligned in the slot for bonding the first bonding wires.

8. The semiconductor package as claimed in claim 1, wherein the substrate has a stepped indentation formed between the external surface and the slot.

9. The semiconductor package as claimed in claim 1, wherein the external terminals include a plurality of solder balls.

10. The semiconductor package as claimed in claim 1, further comprising a second chip having a plurality of second bonding pads, wherein the second chip is back-to-back disposed on the first back surface of the first chip.

11. The semiconductor package as claimed in claim 10, further comprising a plurality of second bonding wires electrically connecting the second bonding pads to the substrate.

12. The semiconductor package as claimed in claim 1, wherein the encapsulant further covers the first back surface of the first chip.

13. The semiconductor package as claimed in claim 1, wherein there is no circuit on a bottom of the depression.

* * * * *